(12) United States Patent
Koda

(10) Patent No.: US 10,247,485 B2
(45) Date of Patent: Apr. 2, 2019

(54) PIPE MEMBER, HEAT PIPE, AND COOLING DEVICE

(71) Applicant: MARUSAN ELECTRONICS CO., LTD., Tokyo (JP)

(72) Inventor: Takahiro Koda, Tokyo (JP)

(73) Assignee: Marusan Electronics Co., Ltd. (JP)

( * ) Notice: Subject to any disclaimer, the term of this patent is extended or adjusted under 35 U.S.C. 154(b) by 0 days.

(21) Appl. No.: 15/745,873

(22) PCT Filed: Aug. 2, 2016

(86) PCT No.: PCT/JP2016/072600
§ 371 (c)(1),
(2) Date: Jan. 18, 2018

(87) PCT Pub. No.: WO2017/068833
PCT Pub. Date: Apr. 27, 2017

(65) Prior Publication Data
US 2018/0216895 A1    Aug. 2, 2018

(30) Foreign Application Priority Data

Oct. 22, 2015 (WO) .................. PCT/JP2015/079786

(51) Int. Cl.
| | |
|---|---|
| *F28D 15/02* | (2006.01) |
| *F28F 1/40* | (2006.01) |
| *F28D 1/047* | (2006.01) |
| *F28D 15/04* | (2006.01) |

(52) U.S. Cl.
CPC ......... *F28D 15/0241* (2013.01); *F28D 1/047* (2013.01); *F28D 15/02* (2013.01); *F28D 15/0266* (2013.01); *F28D 15/043* (2013.01); *F28F 1/40* (2013.01)

(58) Field of Classification Search
CPC ... F28D 15/02; F28D 15/0233; F28D 15/0275
See application file for complete search history.

(56) References Cited

U.S. PATENT DOCUMENTS

2005/0284614 A1* 12/2005 Machiroutu .......... F28D 15/025
                                                            165/104.26

FOREIGN PATENT DOCUMENTS

| JP | 03051697 | * | 3/1991 |
|---|---|---|---|
| JP | H09-126672 A | | 5/1997 |
| JP | H10-52712 A | | 2/1998 |
| JP | 2003-287378 A | | 10/2003 |
| JP | 2006-177652 A | | 7/2006 |

(Continued)

*Primary Examiner* — Eric Ruppert
(74) *Attorney, Agent, or Firm* — Harness, Dickey & Pierce, P.L.C.

(57) ABSTRACT

A pipe member is provided that is capable of configuring a heat pipe that can be installed with a high flexibility in accordance with the state of the installation place. A heat pipe configured by using such a pipe member, and a cooling device are also provided. The pipe member includes: an arbitrarily bendable pipe main body whose both ends are closed when used for the heat pipe; a partition wall extended in an axial direction of the pipe main body to partition the inside of the pipe main body into four passages each being utilized as a flow path of the working fluid; and connection paths which allow neighboring passages to communicate with each other out of the four passages.

8 Claims, 14 Drawing Sheets

(56) References Cited

FOREIGN PATENT DOCUMENTS

| JP | 2013-120053 A | 6/2013 |
|----|---------------|--------|
| JP | 2013-124841 A | 6/2013 |
| JP | 2013-160420 A | 8/2013 |
| JP | 3192498 U | 8/2014 |

* cited by examiner

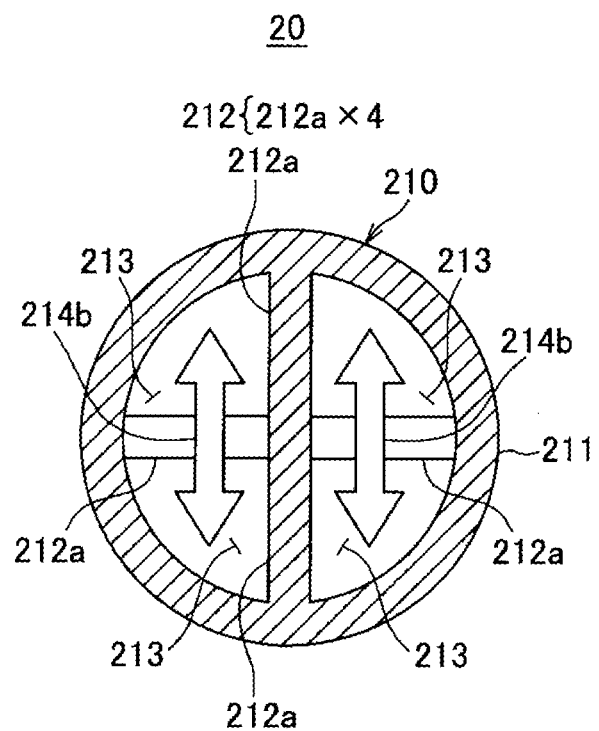

Related Art

Related Art

PIPE MEMBER, HEAT PIPE, AND COOLING DEVICE

CROSS-REFERENCE TO RELATED APPLICATIONS

This application is a U.S. National Stage Application of International Application No. PCT/JP2016/072600, filed on Aug. 2, 2016, and claims priority to PCT/JP2015/079786, filed on Oct. 22, 2015. The entire disclosures of the above applications are incorporated herein by reference.

BACKGROUND

Technical Field

The present invention relates to a pipe member used for a heat pipe, a heat pipe using such pipe member, and a cooling device.

Related Art

Conventionally, a heat pipe is known as a member for transferring heat from a heat receiving part to a heat radiation part when cooling a heat generating component. The heat pipe encloses a working fluid inside the pipe member and transfers heat by the movement of the working fluid.

Among the heat pipes, there is known a type with which a part thereof is heated by the heat received at the heat receiving part, the working fluid is evaporated inside thereof to be in a gas phase, and the heat is transferred with latent heat transport by the movement of the gas phase (e.g., see Japanese Patent Laid Open Publication No. H09-126672). Further, among the heat pipes, there is also known a type with which the working fluid moves in a mixed state of a liquid phase and a gas phase, and latent heat transport by the movement of the gas phase and sensible heat transport by the movement of the liquid phase are executed simultaneously (e.g., see Japanese Patent Laid Open Publication No. 2013-160420).

The heat pipe depicted in JP 2013-160420 is called as a self-oscillating heat pipe since it utilizes self-oscillation generated when the liquid phase is heated and nucleate boiling is caused for moving the working fluid. The self-oscillating heat pipe is drawing an attention since heat transport is carried out with both latent heat transport and sensible heat transport so that it is capable of dealing with heat transport of a large heat flux.

FIGS. 9A and 9B show schematic and block diagram views of a conventional self-oscillating heat pipe. FIG. 9A shows a schematic view of a self-oscillating heat pipe 500, and FIG. 9B shows a block diagram showing behavior of a working fluid 520 in the self-oscillating heat pipe 500.

The self-oscillating heat pipe 500 shown in FIGS. 9A and 9B encloses the working fluid 520 that is a mixture of a liquid phase 521 and a gas phase 522 inside a pipe member 510 formed in a loop-like shape. In the self-oscillating heat pipe 500, heat is transported between an evaporation part 501 where the working fluid 520 evaporates due to a phase change by applying heat and a condensation part 502 where condensation occurs due to a phase change by radiating heat. A part of the pipe member 510 of the self-oscillating heat pipe 500 is shaped in a zigzag form by reciprocating between the evaporation part 501 and the condensation part 502 for a plurality of times.

In the evaporation part 501, thermal expansion of the gas phase 522 occurs and air bubbles generated by nucleate boiling promote expansion of the gas phase 522 so that the pressure is increased. Meanwhile, in the condensation part 502, the pressure is decreased due to condensation of the gas phase 522. Then, due to a pressure difference between the both and pressure shock caused by the nucleate boiling in the evaporation part 501, the liquid phase 521 self-oscillates as shown with an arrow D51 in FIG. 9A.

As a result, as shown with an arrow D52 in FIG. 9A, the gas phase 522 moves from the evaporation part 501 to the condensation part 502. By the movement of the gas phase 522 with expansion and condensation thereof, latent heat transport from the evaporation part 501 to the condensation part 502 is carried out.

Further, the liquid phase 521 self-oscillates between the evaporation part 501 and the condensation part 502 to repeatedly execute heating in the evaporation part 501 and cooling in the condensation part 502. Also, along with the movement of the gas phase 522, the liquid phase 521 moderately circulates inside the loop-like pipe member 510 so that heating and cooling are repeatedly executed by the circulation as well. Such self-oscillation and circulation with heating and cooling of the liquid phase 521 executes sensible heat transport from the evaporation part 501 to the condensation part 502.

By the behavior of the working fluid 520 described above, latent heat transport by the gas phase 522 and sensible heat transport by the liquid phase 521 are simultaneously executed in the self-oscillating heat pipe 500.

However, the self-oscillating heat pipe 500 described above needs to form the pipe member 510 in a loop-like shape for circulating the working fluid 520. Therefore, installation thereof may become difficult depending on the shape of the installation place.

Meanwhile, the type of heat pipe depicted in JP H09-126672 with which the heat is transferred only with latent heat transport does not need to form the pipe member in a loop-like shape. With this type of heat pipe, one end of a bar-like pipe member serves as an evaporation part and the other end serves as a condensation part in many cases. The gas phase generated by evaporation in the evaporation part moves to the condensation part and returns to the liquid phase. The liquid phase needs to be flown back from the condensation part to the evaporation part to be ready for next evaporation. Therefore, on the inner face of the pipe member of the above-described type of heat pipe, minute uneven shapes called wick for introducing the liquid phase to the evaporation part by utilizing capillarity or gravity are formed in many cases. The liquid phase flows back from the condensation part to the evaporation part via the wick.

Since such type of heat pipe does not need to form the pipe member in a loop-like shape, it seems to be highly flexible in terms of installation thereof. However, it is required to have the above-mentioned wick or the like, for example, in the pipe member. Particularly the wick cannot function to help flow-back when the uneven shapes are crushed, so that it may be an obstruction for bending or the like of the pipe member into desired shapes. Therefore, even the type of heat pipe with which the heat is transferred only with latent heat transport may become difficult to be installed depending on the shape of the installation place.

It is therefore an object of the present invention to pay attention to such issues and to provide a pipe member capable of configuring a heat pipe that can be installed with high flexibility in accordance with the state of the installation place and to provide a heat pipe configured by using such pipe member and a cooling device.

SUMMARY OF THE INVENTION

In order to overcome the foregoing issues, the pipe member according to the present invention is a pipe member which is used for a heat pipe and encloses a working fluid inside thereof and transfers heat by movement of the working fluid, and the pipe member includes: an arbitrarily bendable pipe main body whose both ends being closed when used for the heat pipe; a partition wall extended in an axial direction of the pipe main body to partition the inside of the pipe main body into a plurality of passages each being utilized as a flow path of the working fluid; and a connection path which allows at least one of the plurality of passages to communicate with another passage neighboring to the one passage.

Inside the pipe member according to the present invention, at least a pair of passages communicated via the connection path is formed. Thus, through utilizing the pair of passages as the loop-like flow path of the working fluid in the above-described self-oscillating heat pipe, a single rod-like self-oscillating heat pipe, for example, can be configured. Alternatively, by utilizing one of the pair of passages as a moving passage of a gas phase and utilizing the other passage as a flow-back passage of a liquid phase, it is possible to configure a type of heat pipe that transfers heat only with latent heat transport. As a method for utilizing the passage in the pipe member as the flow-back passage of the liquid phase, there is a method which inserts a metal mesh or the like for introducing the liquid phase by capillarity into the passage, for example. Further, since the inside structure thereof is such a simple structure that the inside is partitioned by the partition wall, the bending flexibility is higher than a case of the pipe member where the above-mentioned wick is formed, for example. Therefore, with the pipe member of the present invention, it is possible to configure the self-oscillating heat pipe that can be installed with high flexibility in accordance with the state of the installation place.

Further, in the pipe member according to the present invention, it is preferable for the pipe main body to be a round pipe whose sectional shape orthogonal to the axial direction is a circular shape and preferable for the partition wall to be provided by being extended also in a radius direction of the sectional shape of the pipe main body.

Further, in addition to the fact that bending of the round pipe with the partition wall extended in the radius direction provided inside thereof is easy, the partition wall functions to support the pipe from the inside. This suppresses crush of the pipe when being bent, thereby increasing the strength of the pipe for bending. Furthermore, the pipe member of the heat pipe is also exposed to increase in the internal pressure caused by expansion of the gas phase, resistant to such increase in the internal pressure can also be reinforced by the partition wall supporting the pipe from the inside.

Further, in such preferable pipe member, it is more preferable for the partition wall to have a plurality of wall portions extended radially in the radius direction from a center axis of the pipe main body toward an inner face of the pipe main body.

Since a plurality of partition wall portions are extended radially in the more preferable pipe member, the strength of the pipe for bending can be improved further and the resistance for the increase in the internal pressure described above can be reinforced further as well.

In the pipe member according to the present invention, it is preferable for the connection path to be provided in the vicinity of each of both ends of the pipe main body so that a single or a plurality of loop passages are formed inside the pipe main body when the both ends of the pipe main body are closed.

With the preferable pipe member, it is possible to configure a single rod-like self-oscillating heat pipe of high flexibility in terms of installation by closing the both ends. In the self-oscillating heat pipe, heat transport is carried out with both latent heat transport and sensible heat transport as described above, so that it is advantageous compared to a type of heat pipe that transfers heat only with the latent heat transport in respect that the self-oscillating heat pipe can deal with heat transport of a large heat flux. Also, the heat transmission distance of such type of heat pipe is limited to the distance for which the working fluid can move in a gas state. In the meantime, the self-oscillating heat pipe is also advantageous in terms of the heat transmission distance compared to the type of heat pipe where only the latent heat transport is carried out, since the sensible heat transport of a liquid phase is also carried out in the self-oscillating pipe. With the above-described preferable pipe member, the self-oscillating heat pipe with such advantageous points can be configured with a simple work of closing both ends.

Further, in order to overcome foregoing issues, the heat pipe according to the present invention is a heat pipe which includes a pipe member and a working fluid enclosed inside the pipe member and transfers heat by movement of the working fluid, in which the pipe member is the above-described pipe member according to the present invention.

The heat pipe according to the present invention uses the above-described pipe member of the present invention, so that it is the heat pipe that can be installed with high flexibility in accordance with the state of the installation place.

Further, in order to overcome foregoing issues, the cooling device according to the present invention includes a heat-receiving part, a heat-radiation part, and a heat pipe which transfers heat received at the heat-receiving part, in which: the heat pipe includes a pipe member and a working fluid enclosed inside the pipe member, and transfers the heat by movement of the working fluid; and the pipe member is the above-described pipe member according to the present invention.

In the cooling device according to the present invention, the heat pipe as a structural element is configured by using the above-described pipe member of the present invention. Therefore, it is possible to improve the flexibility at the stage of designing the cooling device such as the shape of the heat pipe, for example.

Advantageous Effect of the Invention

According to the present invention, it is possible to acquire a pipe member capable of configuring a heat pipe that can be installed with high flexibility depending on the state of the installation place and to provide a heat pipe configured by using such pipe member and a cooling device.

BRIEF DESCRIPTION OF THE DRAWINGS

FIGS. 4A-4C show sectional views of sections at three points of the self-oscillating heat pipe shown in FIG. 3;

DETAILED DESCRIPTION OF THE PREFERRED EMBODIMENTS

A first embodiment of a pipe member, a heat pipe, and a cooling device according to the present invention will be described.

Figure 1:
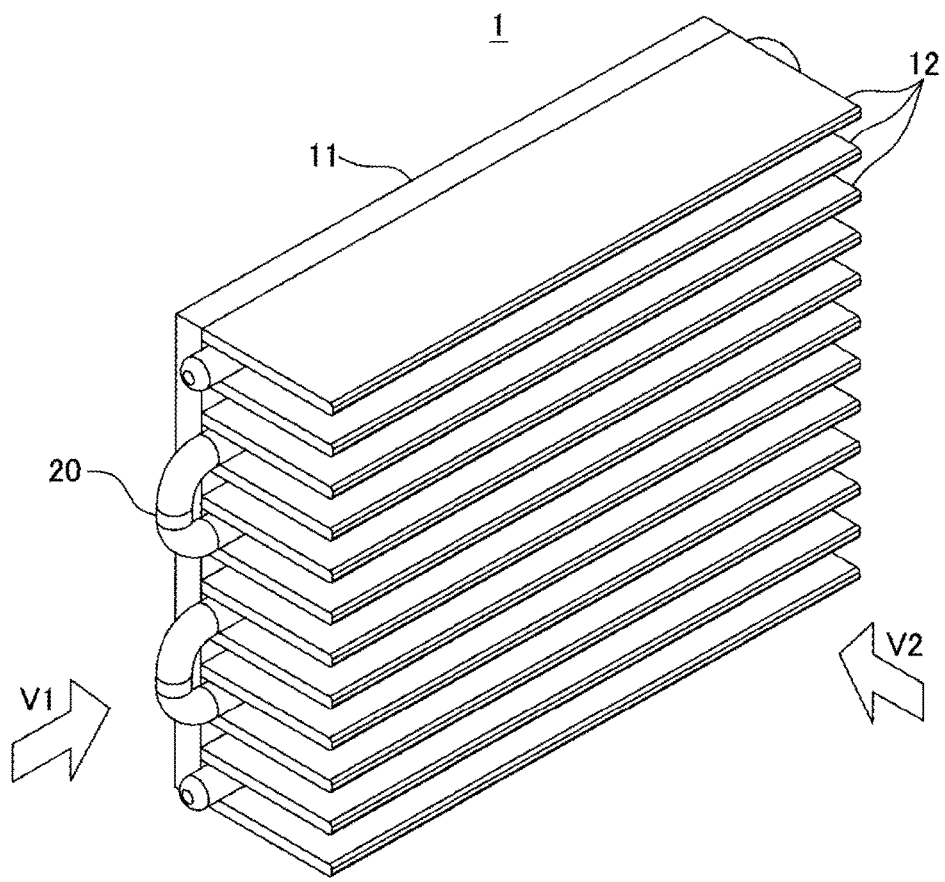
FIG. 1 is a perspective view showing a cooling device according to a first embodiment of the present invention.
Figure 2A:
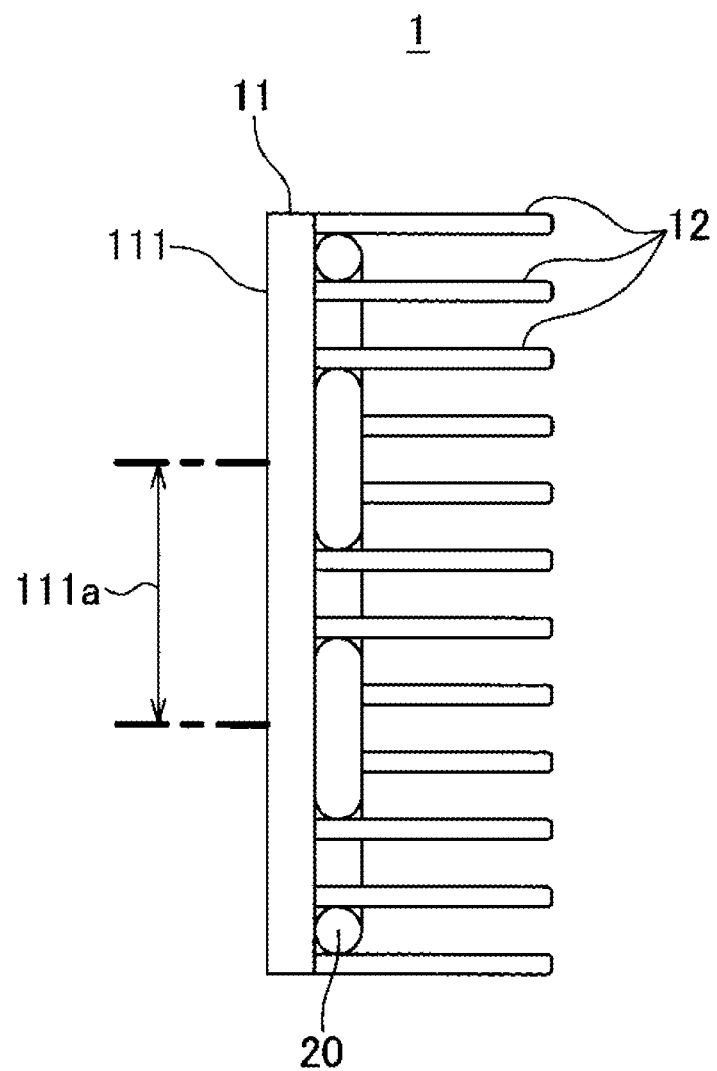
FIG. 2A shows a side view of the cooling device shown in FIG. 1 taken along an arrow V1 of FIG. 1
Figure 2B:
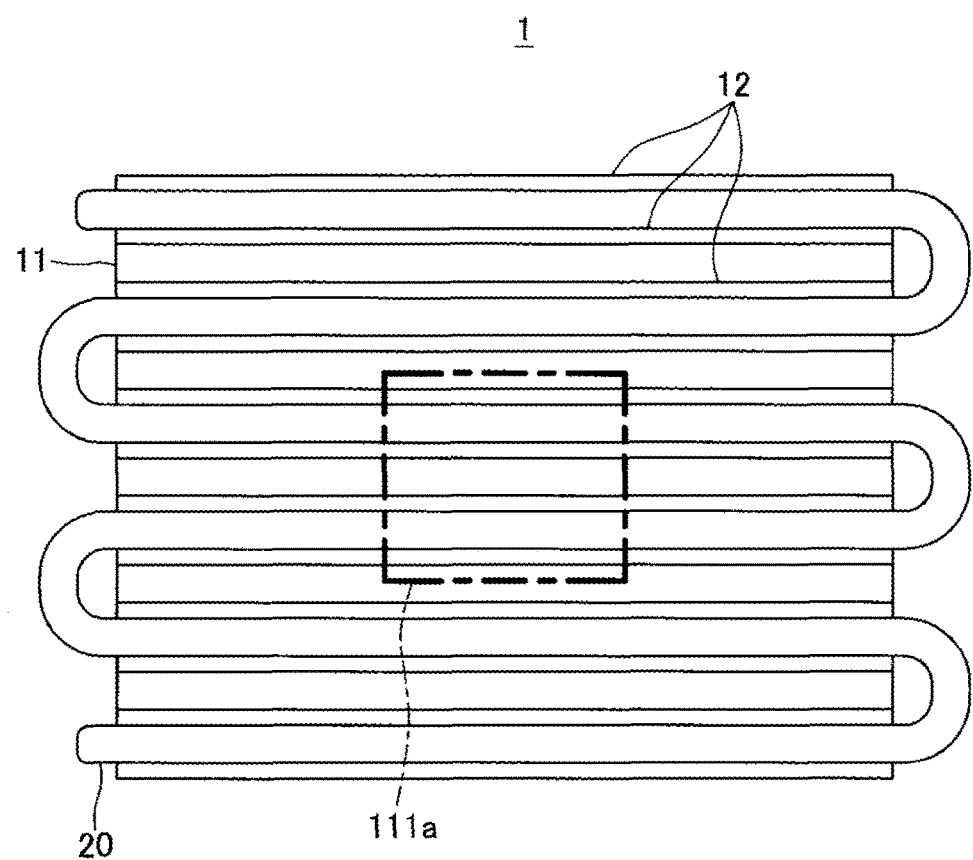
FIG. 2B shows a front elevational view taken along an arrow V2 of FIG. 1.

FIG. 1 is a perspective view showing the cooling device according to the first embodiment of the present invention. Further, FIGS. 2A and 2B show a side view of the cooling device shown in FIG. 1 taken along an arrow V1 of FIG. 1 and a front elevational view taken along an arrow V2 of FIG. 1. FIG. 2A shows the side view, and FIG. 2B shows the front elevational view.

The cooling device 1 shown in FIG. 1 and FIGS. 2A and 2B includes a plate part 11, a heat-radiation fin 12, and a self-oscillating heat pipe 20 to form a heat sink for cooling heat generating components as cooling targets. The self-oscillating heat pipe 20 corresponds to an example of the heat pipe according to the present invention.

The plate part 11 is a rectangular plate having one face thereof in contact with the heat generating component as the cooling target. The heat-radiation fin 12 is a rectangular plate, and a plurality of such fins are erected in parallel to each other at an equivalent pitch on the other face of the plate part 11. In the embodiment, the plate part 11 and the plurality of heat-radiation fins 12 are integrally molded by using aluminum as a single member.

In the embodiment, the heat generating component comes in contact with a part of a back face 111 of the plate part 11 on the opposite side of the heat-radiation fins 12. In FIGS. 2A and 2B, a contact region 111a of the back face 111 for the heat generating component is illustrated with an alternate long and short dash line in substantially the center of the back face 111 as an example. The heat of the heat generating component is absorbed in the contact region 111a. The heat received at the contact region 111a as a heat receiving part is transferred to a peripheral region of the plate part 11 and to the heat-radiation fins 12 and radiated to the surrounding air from the fins 12. By receiving the heat at the contact region 111a in the back face 111 of the plate part 11 and radiating the heat from the heat radiation fins 12, the heat generating component is cooled. The contact region 111a corresponds to an example of the heat-receiving part according to the present invention, and the heat-radiation fins 12 correspond to an example of the heat-radiation part according to the present invention.

The self-oscillating heat pipe 20 is a member serving a function of heat transport for transferring the heat received at the contact region 111a of the plate part 11 to the heat-radiation fins 12 directly or via the peripheral region of the contact region 111a. The self-oscillating heat pipe 20 is a single rod-like member and fixed by being bent in a zigzag form meandering between the heat-radiation fins 12. While the method for fixing the self-oscillating heat pipe 20 in the embodiment is not specified herein, following methods may be employed. That is, it is possible to employ caulking by using the two heat-radiation fins 12 sandwiching the self-oscillating heat pipe 20 or press-fitting of the self-oscillating heat pipe 20 into a space between the two heat-radiation fins 12 disposed to have a slightly narrower space than the thickness of the heat pipe, for example.

Figure 3:
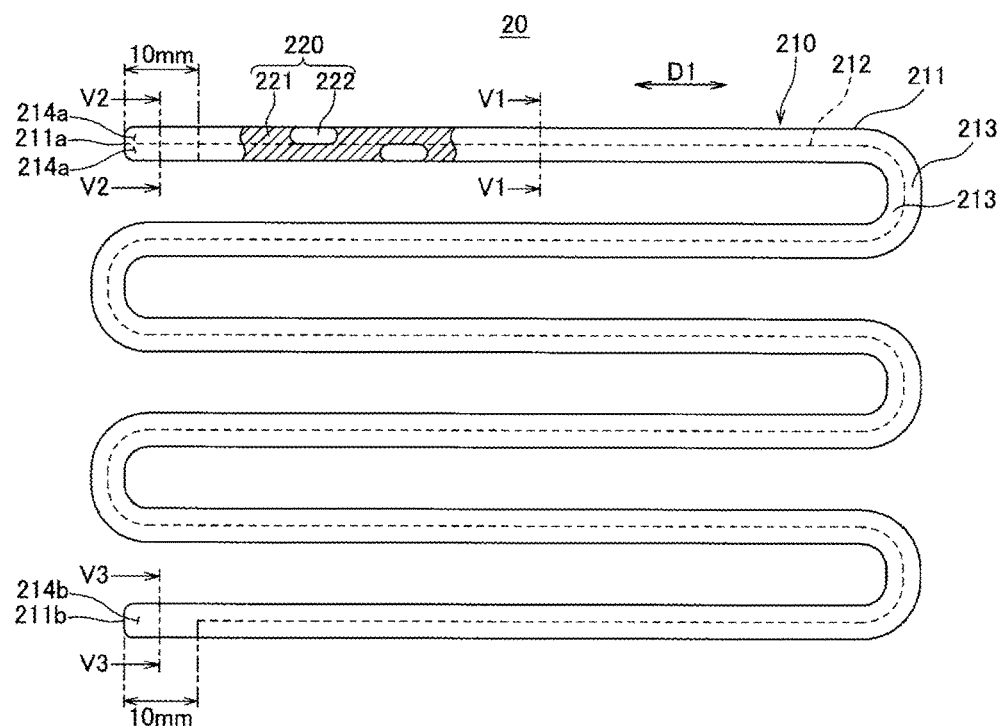
FIG. 3 is a plan view of a self-oscillating heat pipe shown in FIG. 1 taken along the arrow V2 of FIG. 1.
Figure 4A:
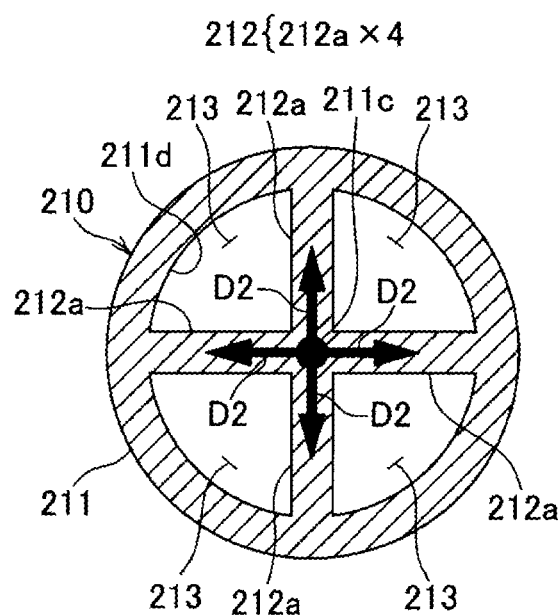
Figure 4B:
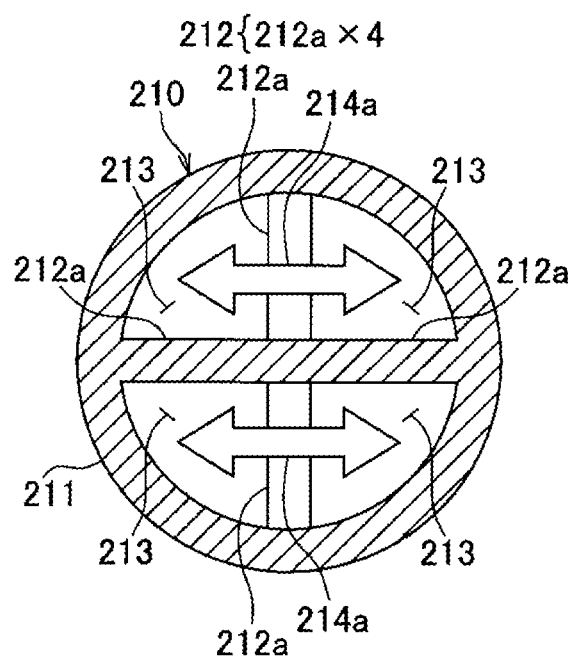

FIG. 3 is a plan view of the self-oscillating heat pipe shown in FIG. 1 taken along the arrow V2 of FIG. 1. Further, FIGS. 4A-4C show sectional views of sections at three points of the self-oscillating heat pipe shown in FIG. 3. FIG. 4A is the sectional view showing the section taken along V1-V1 of FIG. 3, FIG. 4B is the sectional view showing the section taken along V2-V2 of FIG. 3, and FIG. 4C is the sectional view showing the section taken along V3-V3 of FIG. 3.

First, the self-oscillating heat pipe 20 is formed with aluminum and includes a single pipe member 210 and a working fluid 220 enclosed inside the pipe member 210. Heat is transferred by the movement of the working fluid 220. The working fluid 220 is enclosed in a mixed state of a liquid phase 221 and a gas phase 222.

The pipe member 210 includes a pipe main body 211 with both ends 211a and 211b being closed and a partition wall 212 for partitioning the inside thereof. The inside of the pipe main body 211 is partitioned into four passages 213 by the partition wall 212 provided by being extended in an axial direction D1 of the pipe main body 211. Each of the passages 213 is extended in the axial direction D1 of the pipe main body 211 and utilized as a flow path of the working fluid 220.

Note here that the pipe main body 211 in the embodiment is a round pipe whose sectional shape orthogonal to the axial direction D1 is a circular shape. Further, the partition wall 212 is extended in the axial direction D1 and also extended in a radius direction D2 of the sectional shape of the pipe main body 211. More specifically, as shown in FIG. 4A, the partition wall 212 has four wall portions 212a extended radially from a center axis 211c of the pipe main body 211 toward an inner face 211d of the pipe main body 211 while being orthogonal to each other in the radius direction D2. The inside of the pipe main body 211 is partitioned into the four passages 213 by the four wall portions 212a.

Then, a part of each of the four wall portions 212a forming the partition wall 212 in the vicinity of each of the both ends 211a and 211b of the pipe main body 211 is removed to provide connection paths 214a and 214b for communicating the neighboring passages 213 with each other. Through communicating those, a single loop passage to be described later is formed inside the pipe main body 211.

At one end 211a of the pipe main body 211 (FIG. 3), about 10 mm of the two wall portions 212a in the longitudinal direction of the drawing are removed from one end 211a (FIG. 3) while leaving the two wall portions 212a in the lateral direction of the drawing as shown in FIG. 4B. Thereby, the two connection paths 214a each allowing the two passages 213 neighboring to each other in the lateral direction of the drawing to communicate are provided by being arranged in the longitudinal direction of the drawing.

Further, at the other end 211b of the pipe main body 211 (FIG. 3), about 10 mm of the two wall portions 212a in the lateral direction of the drawing are removed from the other end 211b (FIG. 3) while leaving the two wall portions 212a in the longitudinal direction of the drawing as shown in FIG. 4C. Thereby, the two connection paths 214b each allowing the two passages 213 neighboring to each other in the longitudinal direction of the drawing to communicate are provided by being arranged in the lateral direction of the drawing.

Note that the range of the wall portions 212a to be removed is not limited to be about 10 mm from each of the both ends 211a and 211b as described above. There is no specific position and size set therefor as long as the connection paths can be formed to make the loop passage by communicating the neighboring passages with each other.

With two each of the connection paths 214a and 214b, that is, four in total, provided respectively to the both ends 211a and 211b of the pipe main body 211, the four passages 213 are connected to form a following single loop passage inside the pipe main body 211.

Figure 5:
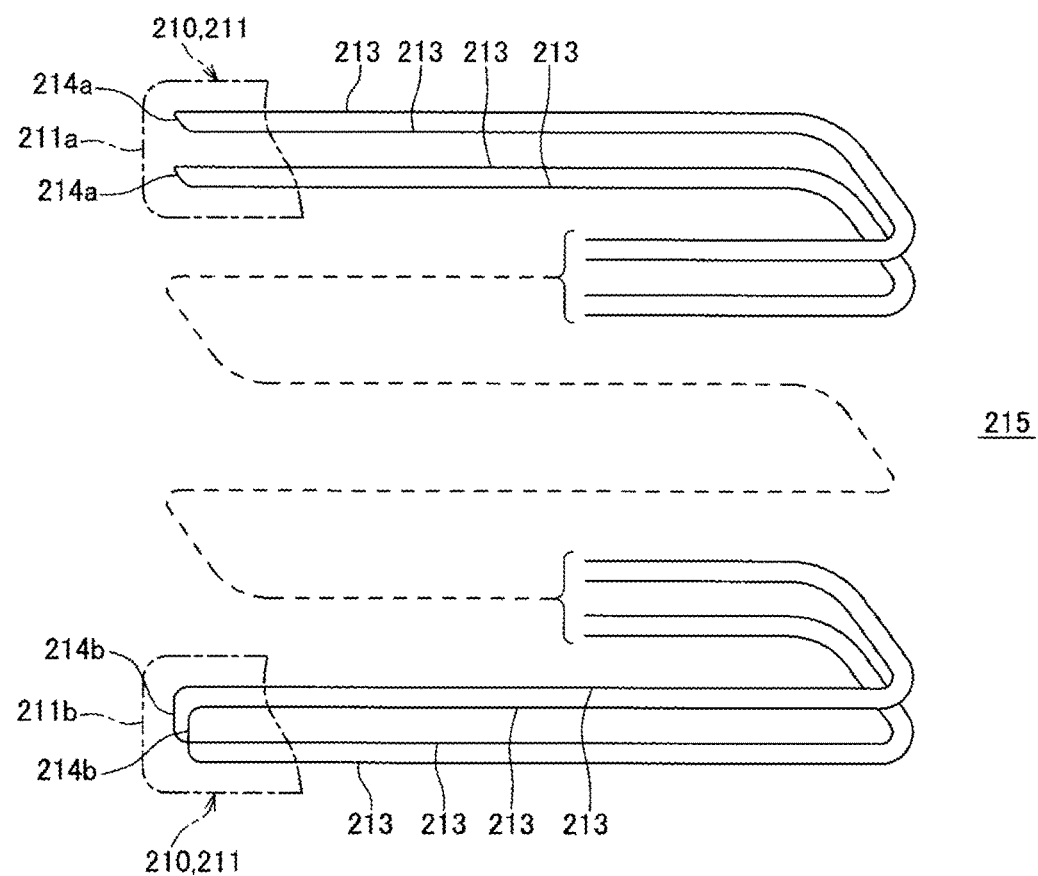
FIG. 5 is a schematic diagram showing a single loop passage formed inside a pipe main body shown in FIG. 3.

FIG. 5 is a schematic diagram showing the single loop passage formed inside the pipe main body shown in FIG. 3.

As shown in FIG. 5, two each of the passages 213 are connected in the lateral direction of the drawing by the two connection paths 214a at one end 211a of the pipe main body 211. Also, two each of the passages 213 are connected in the longitudinal direction of the drawing by the two connection paths 214b at the other end 211b. As a result, formed is a loop passage 215 that makes a loop while reciprocating twice inside the pipe main body 211. Further, in the self-oscillating heat pipe 20 of the embodiment, the single pipe member 210 having the loop passage 215 reciprocating twice inside thereof is bent in a zigzag form by reciprocating three times as shown in FIG. 3. The self-oscillating heat pipe 20 has the working fluid 220 enclosed in such loop passage 215 formed inside the pipe member 210.

Further, in the embodiment, a chlorofluorocarbon refrigerant is employed as the working fluid 220 so that nucleate boiling of the liquid phase 221, expansion and condensation of the gas phase 222 occur in the manner described above in a temperature range (40° C. to 120° C.) used normally in the field of heat sink.

In the embodiment, a pipe of φ5 to φ6 mm having the sectional shape shown in FIG. 4A is formed in a necessary length by extrusion-molding of aluminum. Subsequently, removal-molding of the wall portions 212a is carried out on one end side as shown in FIG. 4B, removal-molding of the wall portions 212a is carried out on the other end side as shown in FIG. 4C, and one end is closed by thermos-compression bonding. Then, after performing vacuum evacuation inside the pipe from the other end and injecting the working fluid 220 of a prescribed proportion of the capacity inside the pipe from the other end, the other end is also closed by thermos-compression bonding. Thereby, completed is the self-oscillating heat pipe 20 in which the working fluid 220 is enclosed in the above-described loop passage 215 in a mixed state of the liquid phase 221 and the gas phase 222.

Figure 9A:
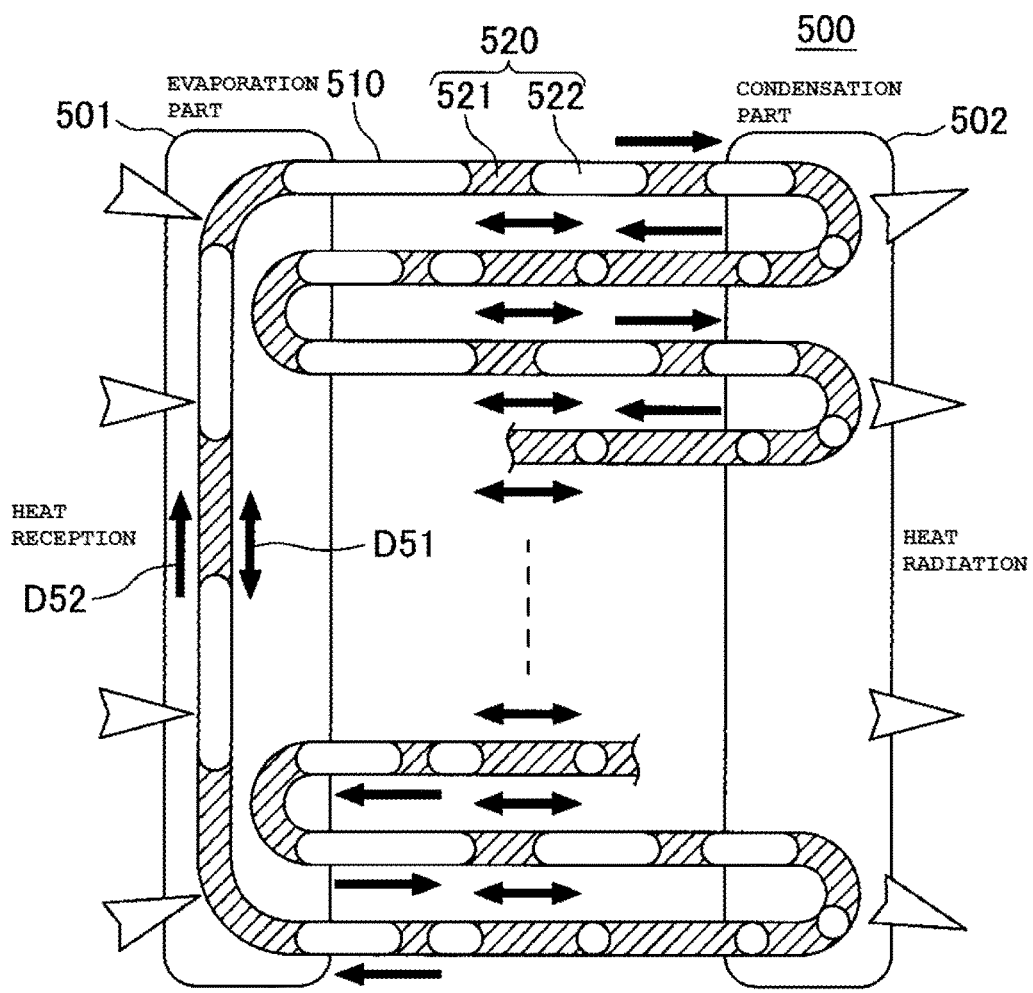
FIGS. 9A and 9B show schematic views of a conventional self-oscillating heat pipe.
Figure 9B:
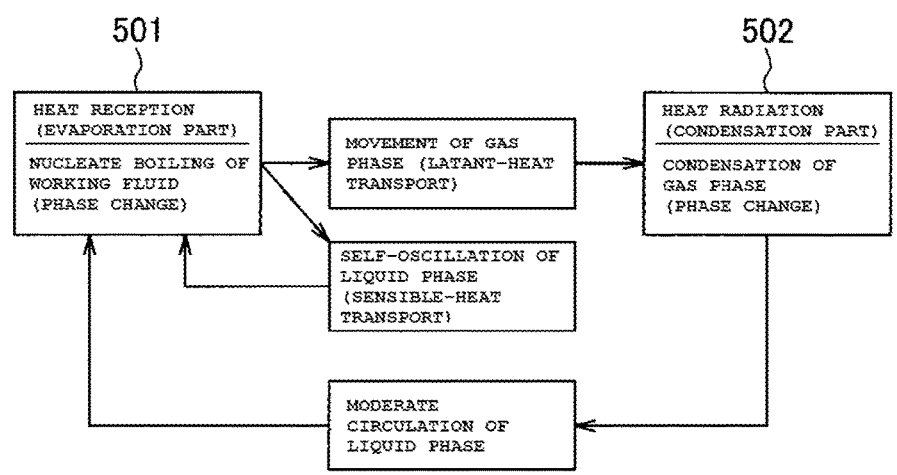

In such loop passage 215, the working fluid 220 behaves in the manner as described by referring to FIG. 9, for example, and sensible heat transport by the liquid phase 221 and latent heat transport by the gas phase 222 are carried out.

In the loop passage 215 of the embodiment, a part passing above the contact region 111a of the plate part 11 of the cooling device 1 shown in FIGS. 2A and 2B serves as the evaporation part. Further, a part passing near the heat-radiation fins 12 at a position sufficiently distant from the contact region 111a serves as the condensation part. Then, sensible heat transport and latent heat transport are carried out between the both parts to transfer the heat.

In the cooling device 1 shown in FIG. 1 and FIGS. 2A and 2B, the heat of the heat generating component absorbed by the contact region 111a of the plate part 11 is transferred to the peripheral region of the plate part 11 and the heat-radiation fins 12 by heat transport of the self-oscillating heat pipe 20 and radiated to the surrounding air from the heat-radiation fins 12.

Figure 6A:
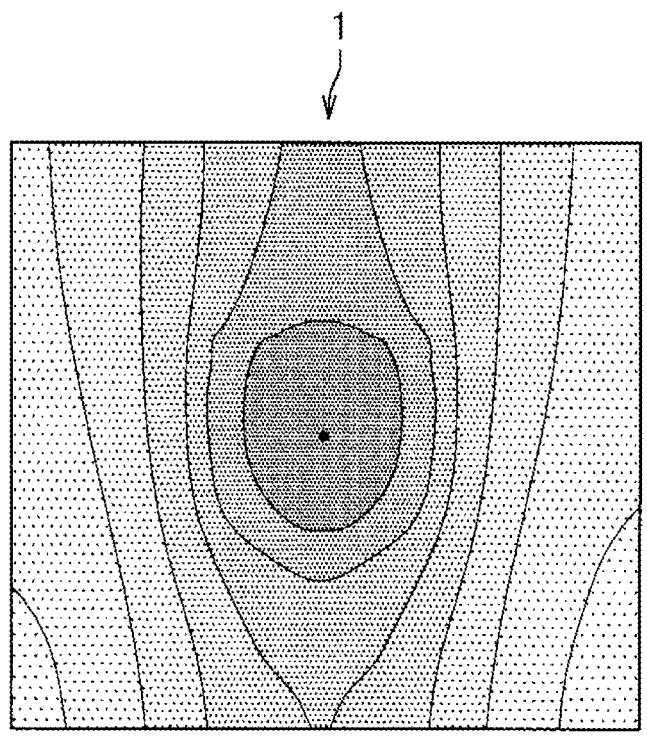
FIGS. 6A-6C show results of analysis showing the cooling effect of the cooling device shown in FIG. 1 and FIG. 2.
Figure 6B:
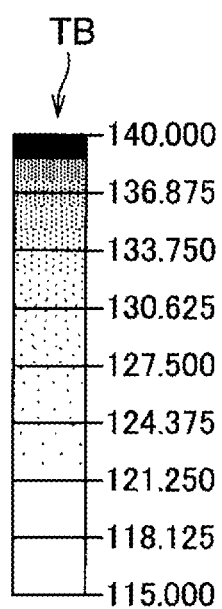
Figure 6C:
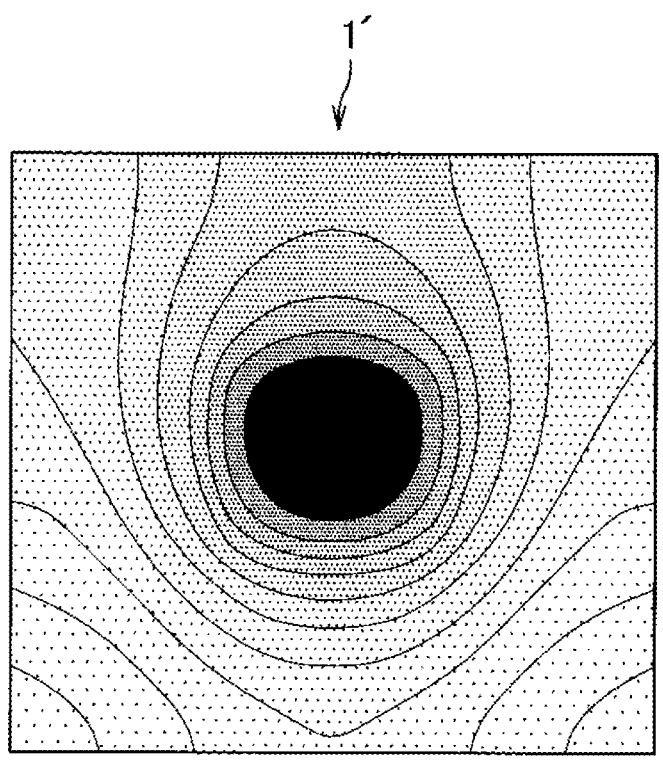

FIGS. 6A-6C show the results of analysis showing the cooling effect of the cooling device shown in FIG. 1 and FIGS. 2A and 2B. FIG. 6A is a temperature distribution in the front elevation of FIG. 2B shown in gradation of hatching as the analysis result showing the cooling effect of the cooling device 1 shown in FIG. 1 and FIG. 2. FIG. 6B is a gradation bar TB showing degrees of the gradation of the drawn hatching. Also, FIG. 6C is the analysis result illustrated in a temperature distribution same as that of FIG. 6A, which shows the cooling effect of a cooling device 1' of a comparative example in which the self-oscillating heat pipe 20 is omitted from the cooling device 1 so as to be compared with the cooling effect of the cooling device 1 according to the embodiment.

The analysis herein was conducted under following analysis conditions. First, the size of the plate part 11 was set as 156 mm×150 mm, and the height of the heat radiation fins 12 was set as 31 mm. Then, the contact region 111a for the heat generating component was defined as a rectangular region of 50 mm×56 mm disposed in the center of the plate part 11, and it was supposed to absorb heat of 100 W in thermal value by the contact region 111a. Further, the cooling device 1 was set to be in a vertically standing posture as shown in FIG. 1, and natural air cooling was employed as the cooling method under an environment at 40° C. surrounding temperature. Furthermore, the cooling device 1 of the embodiment and the cooling device 1' of the comparative example were analyzed under the same conditions except that the self-oscillating heat pipe 20 was not loaded on the cooling device 1' of the comparative example.

In the temperature distribution of the cooling device 1' of the comparative example shown in FIG. 6C, the temperature in the center part corresponding to the contact region 111a for the heat generating component is high and the high-temperature areas are concentrated in the center part. In the meantime, in the temperature distribution of the cooling device 1 of the embodiment shown in FIG. 6A, the high-temperature areas are widely dispersed from the center part corresponding to the contact region 111a to the peripheral regions. It can be seen therefrom that the temperature in the center part is lower than that of the cooling device 1' of the comparative example. Based on that, it is found that the self-oscillating heat pipe 20 in the cooling device 1 of the embodiment sufficiently transfers the heat from the contact region 111a for the heat generating component to the heat-radiation fins 12, thereby sufficiently contributing to cooling of the contact region 111a, that is, the heat generating component.

Inside the pipe member 210 according to the embodiment described above, two pairs of passages 213 communicated by the connection paths 214a and 214b are formed. Those two pairs of passages 213 are utilized as the loop passage 215 for the working fluid 220 in the self-oscillating heat pipe 20 described above. In the embodiment, a single rod-like self-oscillating heat pipe 20 is configured thereby. Since the inside structure of the pipe member 210 of the embodiment is such a simple structure that the inside thereof is partitioned by the partition wall 212, the bending flexibility is higher than a case of the pipe member where the above-mentioned wick is formed, for example. In the embodiment, such pipe member 210 is used to configure the self-oscillating heat pipe 20 that can be installed with high flexibility in accordance with the state of the installation place.

While the self-oscillating heat pipe 20 is shown as an example of the heat pipe according to the present invention, the heat pipe according to the present invention is not limited to that. The heat pipe may also be a type which transfers heat only with latent heat transport by utilizing one of passages of a pipe member communicated via a connection path as a moving passage of a gas phase and utilizing the other passage as a flow-back passage of a liquid phase, for example. As a method for utilizing the passage of the pipe member as the flow-back passage of the liquid phase, there is a method which inserts a metal mesh or the like for introducing the liquid phase by capillarity into the passage, for example.

Further, since the pipe member 210 of the embodiment is made of aluminum, it is lighter than a pipe made of copper, for example, and advantageous in terms of the material cost.

Further, with a self-oscillating heat pipe using a loop-like pipe member whose inside is not partitioned unlike the case of the embodiment, a part where heat is not readily transferred may be formed in the middle due to its loop-like shape. In the meantime, the embodiment is designed to form the loop passage 215 (FIG. 5) inside the single pipe member 210, so that the bending work can be highly flexible. Therefore, it can be used by being bent in an appropriate shape with which the heat can be transferred uniformly.

Further, in addition to the fact that bending of the round pipe member 210 with the partition wall 212 extended in the radius direction D2 provided inside thereof is easy in the embodiment, the partition wall 212 functions to support the member from the inside. This suppresses crush of the pipe member 210 when being bent, thereby increasing the strength of the pipe member 210 for bending. Furthermore, the pipe member 210 is also exposed to increase in the internal pressure caused by expansion of the gas phase 222, resistant to such increase in the internal pressure is also reinforced by the partition wall 212 supporting it from the inside.

Moreover, since the four partition sections 212a forming the partition wall 212 are extended radially in the pipe member 210 of the embodiment, the strength of the pipe main body 211 for bending is improved further and the resistance for the increase in the internal pressure described above is reinforced further as well.

Further, in the embodiment, through forming the single loop passage 215 by connecting the four passages 213, a zigzag passage reciprocating twice or more is formed inside the single pipe member 210. In general, in the self-oscillating heat pipe, the greater the number of reciprocation between the evaporation part and the condensation part, the better the heat transport performance. In the self-oscillating heat pipe 20 of the embodiment, the number of reciprocation of the passage 213 inside the single pipe member 210 is great. Thus, the heat transport performance is improved.

The cooling device 1 of the embodiment includes the above-described self-oscillating heat pipe 20 that can be installed with high flexibility in accordance with the state of the installation place through bending the single pipe member 210 into a desired shape. Thus, the cooling device 1 of the embodiment faces no limit set in terms of the positional relation and the like between the contact region 111a (heat-receiving part) of the heat generating component and the heat-radiation fins 12 (heat-radiating part), so that it is designed under high flexibility.

In view of the convenience in manufacture and use thereof, for example, it is preferable for the pipe main body 211 to be 5.0 mm or less in thickness of the peripheral wall and to be 510 mm² or less in the circular sectional area including the inside space thereof. Further, it is preferable for the partition wall 212 to be 1.0 mm or less in thickness thereof. Furthermore, in view of smooth circulation and the like of the working fluid 220, it is preferable for the passage 213 utilized as the flow path thereof to be 70 % or less in a ratio (volume percentage) occupying the entire volume of the self-oscillating heat pipe 20.

Next, a second embodiment of the pipe member, the heat pipe, and the cooling device according to the present invention will be described. It is to be noted that the second embodiment is different from the first embodiment in regards to the external appearance of the cooling device and the bending shape of the heat pipe to be used. In the meantime, the heat pipe is the self-oscillating heat pipe configured by using the same pipe member as that of the first embodiment, and the inside structure and the like except the bending shape are the same as those of the first embodiment. Hereinafter, the second embodiment will be described by focusing on the points different from the first embodiment and explanations of the same points will be omitted to avoid duplication.

Figure 7:
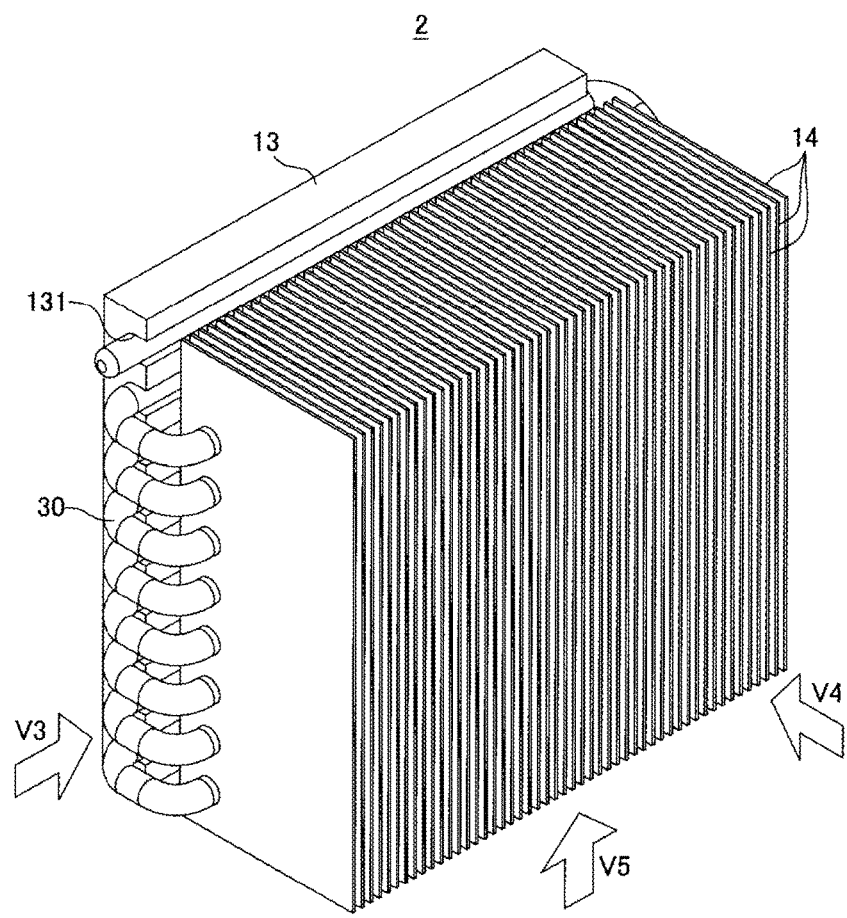
FIG. 7 is a perspective view showing a cooling device according to a second embodiment of the present invention.
Figure 8A:
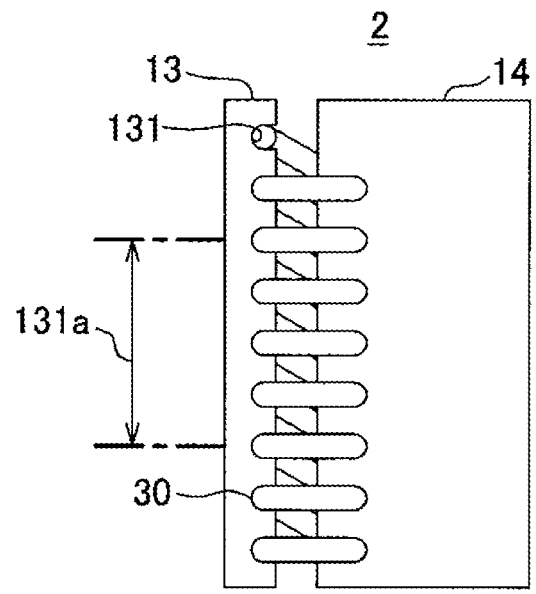
FIGS. 8A-8C show three orthographic views of the cooling device shown in FIG. 7.
Figure 8B:
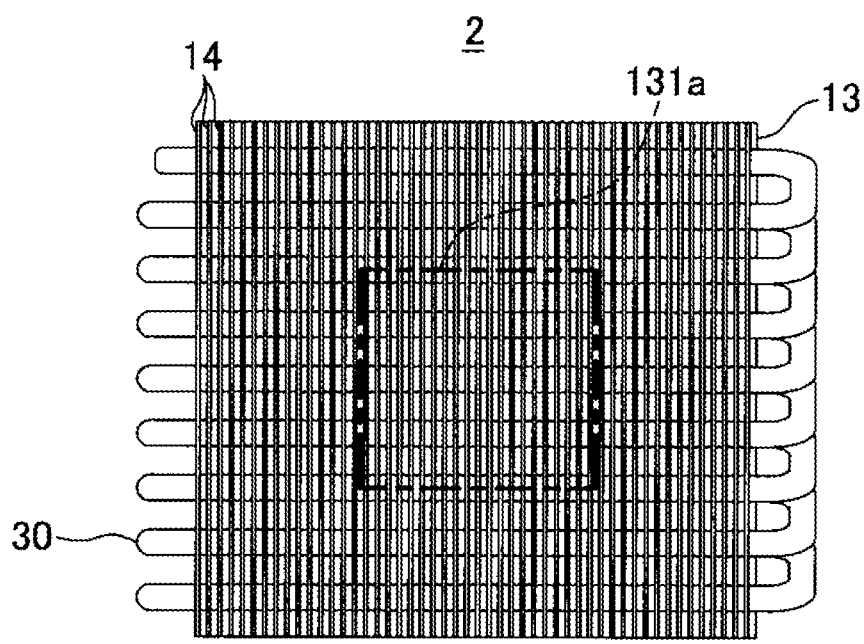
Figure 8C:
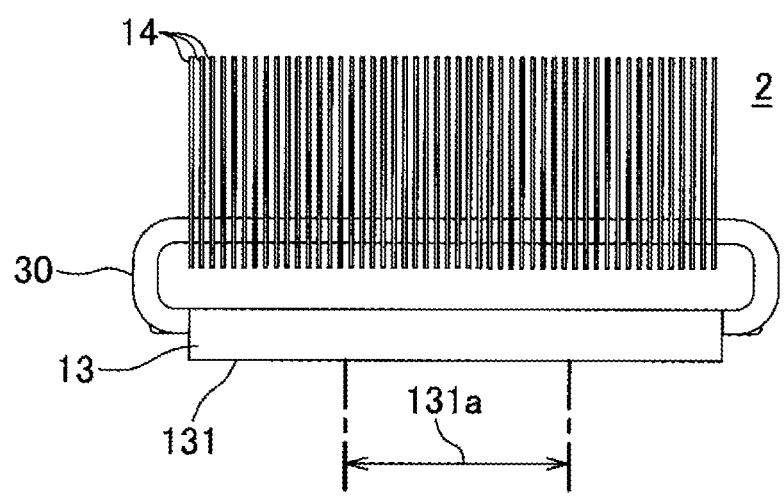

FIG. 7 is a perspective view showing the cooling device according to the second embodiment of the present invention. Further, FIGS. 8A-8C show three orthographic views of the cooling device shown in FIG. 7. FIG. 8A shows a side view taken along an arrow V3 of FIG. 7, FIG. 8B shows a front elevational view taken along an arrow V4 of FIG. 7, and FIG. 8C shows a side view taken along an arrow V5 of FIG. 7.

The cooling device 2 shown in FIG. 7 and FIGS. 8A-8C includes an aluminum plate part 13, aluminum heat-radiation fins 14, and an aluminum self-oscillating heat pipe 30 to form a heat sink which cools a heat generating component as the cooling targets.

The plate part 13 is a rectangular plate which comes in contact via a contact region 131a at one of faces with the heat generating component as the cooling target. On the other face thereof, a plurality of grooves 131 for having the self-oscillating heat pipe 30 fitted thereto are provided in parallel to each other.

A plurality of the heat-radiation fins 14 in a posture erected by being orthogonal to the plate part 13 and also orthogonal to the grooves 131 are arranged in parallel to each other at an equivalent pitch at positions distant from the plate part 13 on the face side of the plate part 13 where the grooves 131 are provided.

The self-oscillating heat pipe 30 is configured by using the same pipe member as that of the self-oscillating heat pipe 20 of the first embodiment described above, and a single loop passage having a working fluid enclosed therein is provided inside thereof. Further, the self-oscillating heat pipe 30 is bent in a spiral form by passing the grooves 131 of the plate part 13 and repeatedly piercing through the plurality of heat-radiation fins 14. Each of the heat-radiation fins 14 is fixed to the self-oscillating heat pipe 30 at the through point, and the self-oscillating heat pipe 30 is fixed to the grooves 131 of the plate part 13. As described, in the cooling device 2 of the embodiment, the plate part 13 and the plurality of heat-radiation fins 14 are connected by the spiral-form self-oscillating heat pipe 30.

In the self-oscillating heat pipe 30, the loop passage inside the part passing above the contact region 131a of the plate part 13 functions as an evaporation part where evaporation is caused by the heat from the heat generating component. Further, the loop passage inside the part piercing through the heat-radiation fins 14 functions as a condensation part where condensation is caused by radiation of the heat. Further, latent heat transport by the movement of the gas phase and sensible heat transport by the movement of the liquid phase are carried out simultaneously between the both.

In the cooling device 2 shown in FIG. 7 and FIG. 8A-8C, the heat of the heat generating component absorbed by the contact region 131a of the plate part 13 is transferred to the heat-radiation fins 14 by the above-described heat transport in the self-oscillating heat pipe 30 and radiated to the surrounding air from the heat-radiation fins 14.

The second embodiment described above also uses the self-oscillating heat pipe 30 configured with the same pipe member as that of the first embodiment, so that it is needless to mention that various effects achieved because of the structure of the pipe member (i.e., the self-oscillating heat pipe 30) can be acquired as well.

It is to be noted that the embodiments described above are merely the typical modes of the present invention, and the present invention are not limited only to those embodiments. That is, various changes and modifications can be applied without departing from the scope of the present invention. The present invention naturally includes such modifications as long as those modes include the structures of the heat pipe and the cooling device of the present invention.

For example, in the above-described embodiments, the self-oscillating heat pipe 20 of the first embodiment bent in a zigzag form and the self-oscillating heat pipe 30 of the second embodiment bent in a spiral form are shown as examples of the heat pipe according to the present invention. However, the heat pipe according to the present invention is not limited to those. The specific shape thereof can be set as an arbitrary shape in accordance with the installing state of the heat pipe.

Further, in the above-described embodiments, shown as an example of the pipe member according to the present invention is the pipe member 210 in which the inside of the pipe main body 211 is partitioned into the four passages 213. However, the pipe member according to the present invention is not limited to that. The number of passages is not specifically limited as long as the inside of the pipe main body is partitioned into a plurality of passages.

Furthermore, in the above-described embodiments, the self-oscillating heat pipes 20 and 30 with the single loop passage 215 formed inside thereof are shown as examples of the heat pipe according to the present invention. However, the heat pipe according to the present invention is not limited to those. A pipe with a plurality of loop passages formed inside thereof, for example, may be used as well. As "a pipe with a plurality of loop passages formed inside thereof" mentioned herein, there may be a pipe in which two each out of four passages are connected to form two loop passages, for example.

Further, in the above-described embodiments, the aluminum-made pipe member 210 is shown as an example of the pipe member according to the present invention and also the cooling devices 1, 2 provided with the aluminum-made plate parts 11, 13 and the heat-radiation fins 12, 14 are shown as examples of the cooling device according to the present invention. However, the pipe member and the cooling device according to the present invention are not limited to be made of aluminum. The pipe member and the cooling device according to the embodiment may be made of copper, for example. There is no specific limit set for the materials thereof.

Further, in the embodiments described above, a chlorofluorocarbon refrigerant is shown as an example of the working fluid according to the present invention. However, the working fluid according to the present invention is not limited to that. As the working fluid according to the present invention, it is possible to employ various kinds of refrigerants such as water and $CO_2$ depending on the use temperature range of the heat pipe, the material of the pipe member, and the like.

Further, in the embodiments described above, shown as examples of the cooling device according to the present invention are the cooling devices 1, 2 in which the contact regions 111a, 131a for the heat generating component are formed in a respective part of the plate parts 11, 13, and the contact regions 111a, 131a function as the heat-receiving part. However, the cooling device according to the present invention is not limited to those. For example, the cooling device may be such a type where the entire faces of the plate parts 11, 13 come in contact with the heat generating component and function as the heat-receiving part. There is no specific limit set on the mode of the heat-receiving part of the cooling device.

Further, in the embodiments described above, shown as examples of the cooling device according to the present invention are the cooling devices 1, 2 in which a plurality of rectangular heat-radiation fins 12, 14 arranged in parallel to each other at equivalent pitch function as the heat-radiation part. However, the cooling device according to the present invention is not limited to those. For example, the shapes of the heat-radiation fins may be arbitrary shapes such as a circular shape and the like. Also, the cooling device according to the present invention may be a type that uses a water-cooled plate or a water-cooled pipe with which the heat pipe comes in contact or a refrigerant tank to which the heat pipe is directly immersed, for example, as the heat-radiation part.

As described, in the cooling device according to the present invention, no specific limit is set on the mode of the heat-radiation part.

What is claimed is:

1. A heat pipe member comprising:
a main pipe having first and second ends opposite to each other, each of the first and second ends being closed so that the main pipe has a closed inner space;
a partition wall that divides the inner space of the main pipe into four or more passages, the four or more passages being arranged radially around a center axis of the main pipe so that each of the four or more passages extends along the main pipe; and
first and second connection paths that are formed in the vicinity of the first and second ends of the main pipe, respectively, the first connection path being fluidly connected between two adjacent passages of the four or more passages, the second connection path being fluidly connected between the other two adjacent passages of the four or more passages,
wherein the four or more passages, the first connection path, and the second connection path configure a single closed loop through which a working fluid flows.

2. The heat pipe member according to claim 1,
wherein the main pipe is in a cylindrical shape, and the main pipe is bendable.

3. The heat pipe member according to claim 2,
wherein the partition wall is configured with a plurality of sub-walls, and each of the plurality of sub-walls radially extends from the center axis of the main pipe.

4. The heat pipe member according to claim 1,
wherein the partition wall is configured with a plurality of sub-walls, and each of the plurality of sub-walls radially extends from the center axis of the main pipe.

5. A cooling device comprising:
a heat receiver that is configured to receive heat from a heat generator component;
a heat pipe member that is configured to transfer the heat that is received by the heat receiver, the heat pipe including;
  a main pipe having first and second ends opposite to each other, each of the first and second ends being closed so that the main pipe has a closed inner space;
  a partition wall that divides the inner space of the main pipe into four or more passages, the four or more passages being arranged radially around a center axis of the main pipe so that each of the four or more passages extends along the main pipe; and
  first and second connection paths that are formed in the vicinity of the first and second ends of the main pipe, respectively, the first connection path being fluidly connected between two adjacent passages of the four or more passages, the second connection path being fluidly connected between the other two adjacent passages of the four or more passages; and
a heat-radiator that is configured to radiate the heat that is transferred by the heat pipe member,
wherein the four or more passages, the first connection path, and the second connection path configure a single closed loop through which a working fluid flows.

6. The cooling device according to claim 5,
wherein the main pipe is in a cylindrical shape, and the main pipe is bendable.

7. The cooling device according to claim 6,
wherein the partition wall is configured with a plurality of sub-walls, and each of the plurality of sub-walls radially extends from the center axis of the main pipe.

8. The cooling device according to claim 5,
wherein the partition wall is configured with a plurality of sub-walls, and each of the plurality of sub-walls radially extends from the center axis of the main pipe.

* * * * *